(12) United States Patent
Nakane

(10) Patent No.: US 8,237,394 B2
(45) Date of Patent: Aug. 7, 2012

(54) METHOD FOR INITIALIZING INDICATING INSTRUMENT FOR VEHICLE

(75) Inventor: Hideyuki Nakane, Nishio (JP)

(73) Assignee: Denso Corporation, Kariya (JP)

( * ) Notice: Subject to any disclaimer, the term of this patent is extended or adjusted under 35 U.S.C. 154(b) by 388 days.

(21) Appl. No.: 12/661,811

(22) Filed: Mar. 24, 2010

(65) Prior Publication Data

US 2010/0242570 A1 Sep. 30, 2010

(30) Foreign Application Priority Data

Mar. 25, 2009 (JP) ................................. 2009-075028

(51) Int. Cl.
*G01D 11/16* (2006.01)
*G01P 3/50* (2006.01)

(52) U.S. Cl. .......................... 318/696; 73/1.37; 116/62.1

(58) Field of Classification Search .................. 318/685, 318/696; 116/62.1, 284–290; 73/1.37
See application file for complete search history.

(56) References Cited

U.S. PATENT DOCUMENTS

| | | | |
|---|---|---|---|
| 5,877,694 A | | 3/1999 | Kataoka |
| 6,731,092 B2 * | | 5/2004 | Shimazaki ..................... 318/685 |
| 6,798,164 B2 * | | 9/2004 | Umehara et al. .............. 318/685 |
| 7,034,496 B2 * | | 4/2006 | Oishi ............................ 318/696 |
| 2002/0039011 A1 | | 4/2002 | Shimazaki |
| 2002/0117988 A1 | | 8/2002 | Komura |
| 2003/0094916 A1 * | | 5/2003 | Umehara et al. .............. 318/696 |

FOREIGN PATENT DOCUMENTS

| | | |
|---|---|---|
| JP | 2006-101655 | 4/2006 |
| JP | 2006-352948 | 12/2006 |

OTHER PUBLICATIONS

Office action dated Apr. 15, 2011 in corresponding Japanese Application No. 2009-75028.

* cited by examiner

*Primary Examiner* — Bentsu Ro
(74) *Attorney, Agent, or Firm* — Harness, Dickey & Pierce, PLC

(57) ABSTRACT

According to a method for initializing an indicating instrument for a vehicle, zero-reset processing is performed. In the zero-reset processing, a control device is made to control a drive signal to rotate a pointer in a zero-reset direction in order to force a step motor to lose synchronization. Furthermore, synchronization loss detection processing is performed. In the detection processing, a physical phenomenon generated in a rotary drive system due to forcible synchronization loss of the motor during the zero-reset processing, is detected. Then, an electrical angle of the drive signal at a time of detection of the phenomenon is selected as a synchronization loss electrical angle. Finally, zero point setting processing is performed. In the setting processing, the electrical angle phase-shifted from the synchronization loss electrical angle in an indication value increasing direction by 180 degrees or less, is set as a zero point stored in the control device.

13 Claims, 15 Drawing Sheets

METHOD FOR INITIALIZING INDICATING INSTRUMENT FOR VEHICLE

CROSS REFERENCE TO RELATED APPLICATION

This application is based on and incorporates herein by reference Japanese Patent Application No. 2009-75028 filed on Mar. 25, 2009.

BACKGROUND OF THE INVENTION

1. Field of the Invention

The present invention relates to a method for initializing an indicating instrument for a vehicle.

2. Description of Related Art

Conventionally, an indicating instrument for a vehicle is known. The indicating instrument rotates a pointer through application of a drive signal, which alternates in accordance with an electrical angle, to a field winding of a step motor, and indicates a vehicle state value which accords with a rotational position of the pointer. In such an indicating instrument, the pointer returns to a zero position, which indicates a zero value of the vehicle state value, as a result of rotation of the pointer in a zero-reset direction, and the pointer is stopped at a stopper position, which is located within a predetermined range from the zero position in the zero-reset direction, through a stopper mechanism. The control of the drive signal is performed based on the electrical angle corresponding to this stopper position.

For example, an indicating instrument for a vehicle described in Patent No. JP3770095B2 (corresponding to US2002/0117988A1) detects an induced voltage generated in a field winding, controlling a drive signal applied to the field winding of a step motor so as to rotate the pointer in the zero-reset direction. Accordingly, the induced voltage is generated in the field winding during the rotation of the pointer, whereas the induced voltage generated in the field winding is reduced when the pointer stops. For this reason, if a detected voltage of the induced voltage generated in the field winding is equal to or smaller than a set value, the electrical angle corresponding to the stopper position is updated on the assumption that the pointer has stopped at the stopper position. By such a series of processings, even though the step motor has lost synchronization due to disturbance such as vibration, so that the rotational position of the pointer is displaced before the indicating instrument is started, the drive signal is accurately controlled based on the updated electrical angle.

An indicating instrument for a vehicle described in Patent No. JP3389727B2 (corresponding to U.S. Pat. No. 5,877,694A) continues application of the drive signal to the field winding of a step motor, to rotate the pointer in the zero-reset direction thereby pressing against a stopper mechanism. Accordingly, the pointer is reliably stopped at the stopper position, and the electrical angle corresponding to the stopper position is correctly updated. Therefore, even if the rotational position of the pointer is shifted as a result of the loss of synchronization of the step motor before the indicating instrument is started, the drive signal is accurately controlled based on the updated electrical angle.

In the above-described indicating instruments in JP3770095B2 and JP3389727B2, the subsequent control of the drive signal is carried out based on the electrical angle, which is initialized corresponding to the stopper position before product shipment. In consequence, if the initialization of the electrical angle that corresponds to the stopper position is inaccurate, the drive signal control contains an error from the beginning, i.e., before product shipment. Because of this, there is concern in the worst case that unintended synchronization loss of the step motor is caused after product shipment and erroneous indication of the vehicle state value by the pointer may be thereby brought about.

Accordingly, in JP3770095B2, the electrical angle of the drive signal is gradually changed so as to rotate the pointer, which has been rotated to the stopper position, in an indication value increasing direction that is opposite from the zero-reset direction. Then, the electrical angle when the pointer is separated from the stopper position or immediately before this separation, is initialized as the electrical angle corresponding to the stopper position. However, by such a method, the shift of the rotational position of the pointer in the indication value increasing direction in accordance with the gradual change of the electrical angle is small. Thus, the separation of the pointer from the stopper position is difficult to detect, so that accuracy of the initialization of the electrical angle corresponding to the stopper position may be reduced.

SUMMARY OF THE INVENTION

The present invention addresses at least one of the above disadvantages.

According to the present invention, there is provided a method for initializing an indicating instrument for a vehicle. The instrument includes a pointer, a step motor, a rotary drive system, a stopper mechanism, and a control means. The pointer is rotatable in a zero-reset direction to return to a zero position, which indicates a zero value of a vehicle state value of the vehicle. The step motor includes a field winding and is configured to rotate the pointer upon application of a drive signal, which alternates in accordance with an electrical angle, to the field winding. The rotary drive system ranges from the step motor to the pointer. The stopper mechanism is configured to stop the pointer, which rotates in the zero-reset direction, at a stopper position located within a predetermined range from the zero position in the zero-reset direction. The control means is for controlling the drive signal based on a zero point, which is the electrical angle that corresponds to the stopper position. According to the method, zero-reset processing is performed. In the zero-reset processing, the control means is made to control the drive signal to rotate the pointer in the zero-reset direction in order to force the step motor to lose synchronization. Furthermore, synchronization loss detection processing is performed. In the synchronization loss detection processing, a first physical phenomenon, which is generated in the rotary drive system due to forcible synchronization loss of the step motor during the zero-reset processing, is detected. Then, the electrical angle of the drive signal at a time of detection of the first physical phenomenon is selected as a synchronization loss electrical angle. Finally, zero point setting processing is performed. In the zero point setting processing, the electrical angle, which is phase-shifted from the synchronization loss electrical angle in an indication value increasing direction by 180 degrees or less, is set as the zero point which is stored in the control means. The indication value increasing direction is opposite from the zero-reset direction.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of the invention will be described below with reference to the accompanying drawings. By using the same numerals to indicate corresponding components in the embodiments, repeated explanations are omitted.

First Embodiment

Figure 1:
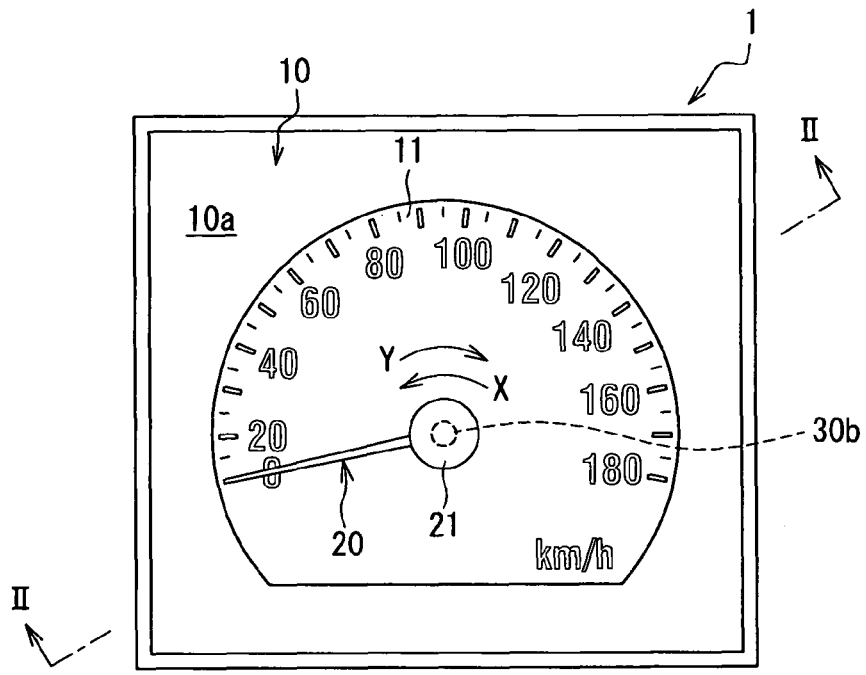
FIG. 1 is a front view illustrating an indicating instrument for a vehicle in accordance with a first embodiment of the invention.
Figure 2:
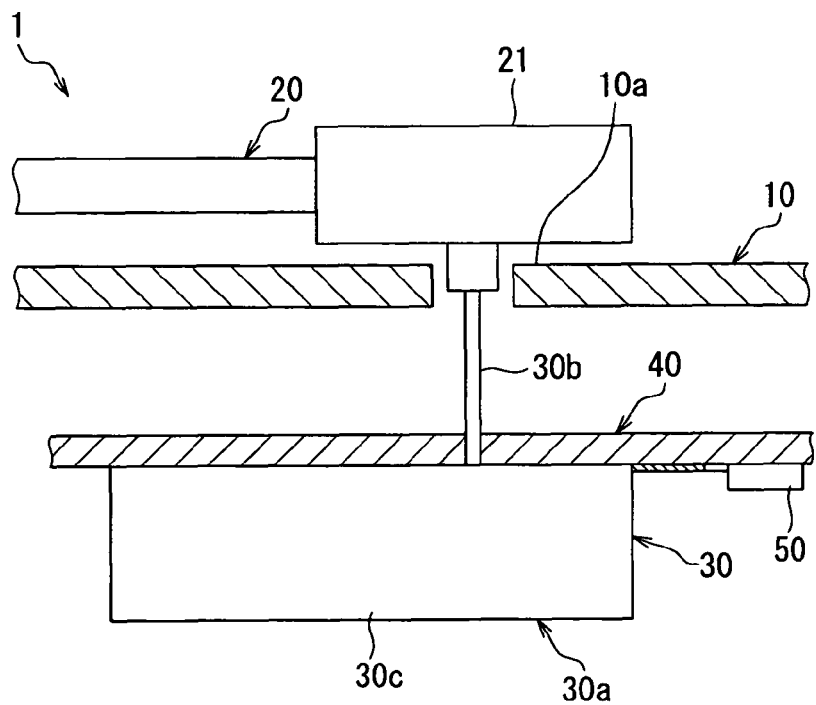
FIG. 2 is a vertical cross-sectional view taken along a line II-II in FIG. 1.
Figure 3:
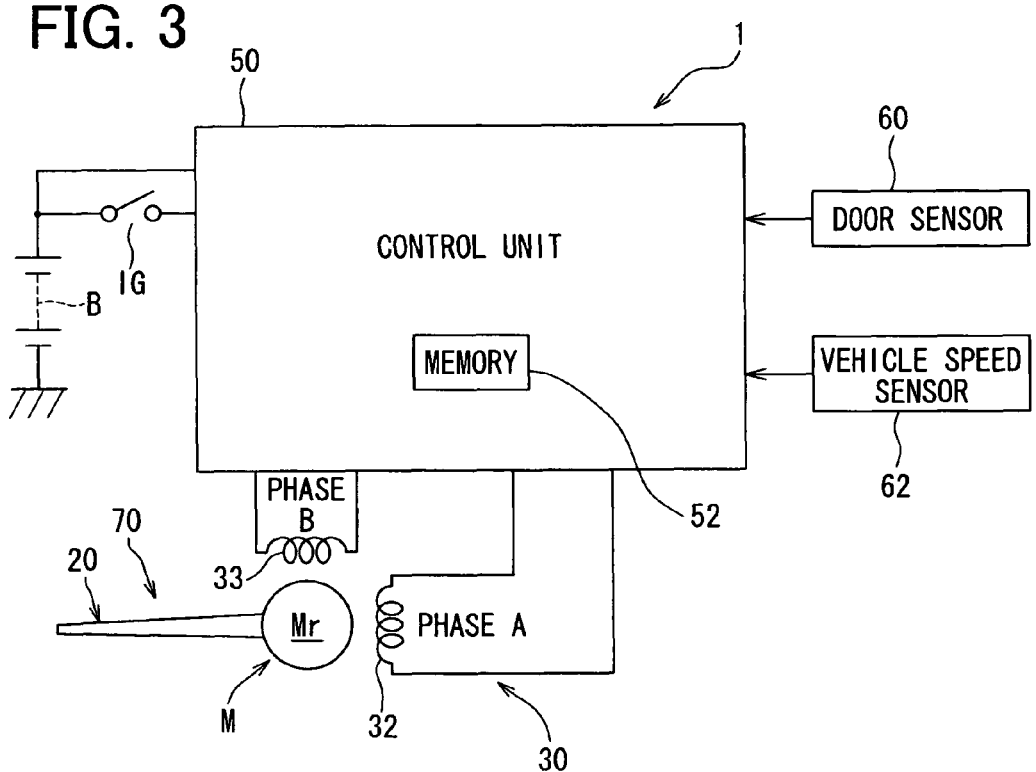
FIG. 3 is a block diagram illustrating an electric circuit configuration of the indicating instrument in accordance with the first embodiment.

A first embodiment of the invention will be described below with reference to the accompanying drawings. FIG. 1 illustrates an indicating instrument 1 for a vehicle according to the first embodiment, to which a method for initialization of the invention is applied. The indicating instrument 1 is disposed in front of a driver seat inside the vehicle as a vehicle speed meter. As illustrated in FIGS. 1 to 3, the indicating instrument 1 includes an instrument board 10, a pointer 20, a rotating inner device 30, a board 40, and a control unit 50. The control unit 50 may serve as a control means.

The instrument board 10 illustrated in FIGS. 1 and 2 is disposed with its display surface 10a directed toward the driver seat, and includes a vehicle speed display 11 that displays a vehicle speed value as a vehicle state value. The vehicle speed display 11 displays vehicle speed values in a shape of a circular arc from a zero value (0 km/h), which is a reference for the vehicle speed values, to an upper limit (180 km/h).

The pointer 20 is coupled to a pointer shaft 30b of the rotating inner device 30 on its base end portion 21 side, and rotatable in a zero-reset direction X and in a speed increasing direction Y, which is opposite from the direction X, along the display surface 10a of the instrument board 10. Accordingly, the pointer 20, which indicates a vehicle speed value in accordance with a rotational position among those displayed on the vehicle speed display 11, is returnable back to a zero position that indicates the zero value, by its rotation in the zero-reset direction X as illustrated in FIG. 1.

As illustrated in FIG. 2, the rotating inner device 30 includes a main body 30a of the inner device, the pointer shaft 30b, and a casing 30c. The main body 30a is disposed on a back surface side of the board 40 which is generally parallel to the instrument board 10. The main body 30a includes a two-phase step motor M, a reduction gear mechanism G, and a stopper mechanism S (see FIG. 4), which are incorporated into the casing 30c. The pointer shaft 30b is supported by the casing 30c, which is fixed on the back surface of the board 40, and passes through the board 40 and the instrument board 10 to hold the base end portion 21 of the pointer 20. Accordingly, the main body 30a may rotate the pointer shaft 30b, which is coaxial with an output stage gear 34 of the reduction gear mechanism G, and eventually, the pointer 20 by deceleration rotation of the reduction gear mechanism G that is in synchronization with rotation of the step motor M.

Figure 4:
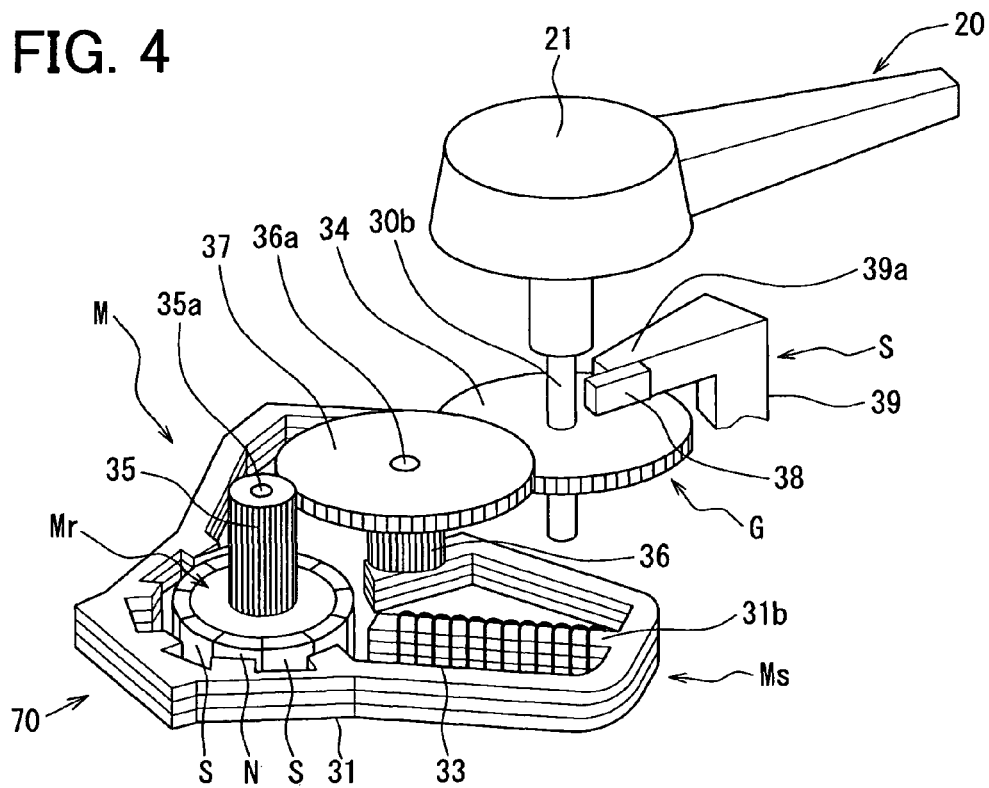
FIG. 4 is a perspective view illustrating a main feature of the indicating instrument in accordance with the first embodiment.
Figure 5:
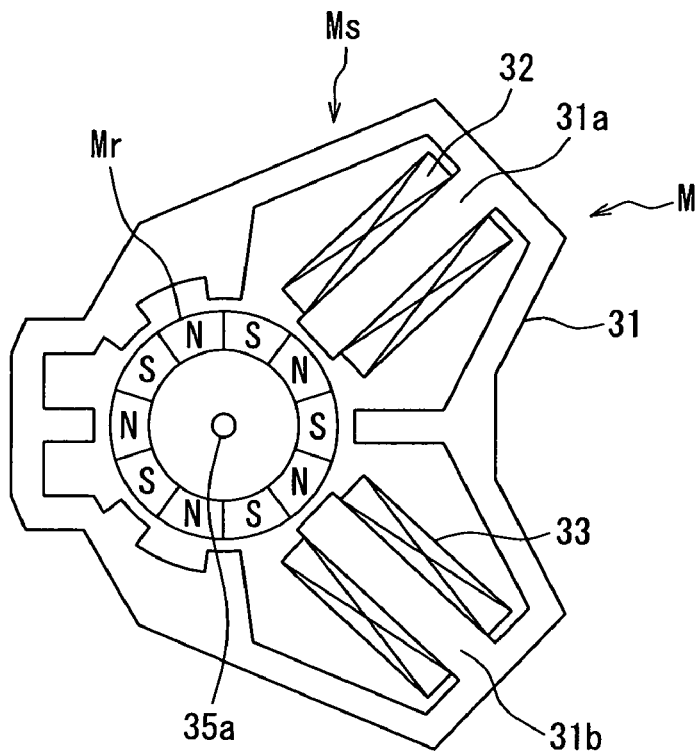
FIG. 5 is a plan view illustrating the main feature of the indicating instrument in accordance with the first embodiment.

As illustrated in FIGS. 4 and 5, the step motor M includes a stator Ms and a magnet rotor Mr, which are combined together. The stator Ms has a yoke 31 and two field windings 32, 33. The yoke 31 includes a pair of magnetic poles 31a, 31b having a shape of a pole, and an A-phase field winding 32 is wound around the magnetic pole 31a, whereas a B-phase field winding 33 is wound around the magnetic pole 31b. The magnet rotor Mr is fixed to a rotatable shaft 35a of the reduction gear mechanism G coaxially with the rotatable shaft 35a. Clearances are formed between a peripheral surface of the magnet rotor Mr and front end surfaces of the magnetic poles 31a, 31b of the yoke 31, and a north pole and a south pole serving as magnetic poles are formed alternately on the peripheral surface of the magnet rotor Mr in a rotational direction of the rotor Mr.

In the step motor M having the above-described, structure, an A-phase drive signal of such an alternating current that voltage alternates in the shape of a cosine function in accordance with the electrical angle (see FIG. 6) is applied to the A-phase field winding 32. On the other hand, a B-phase drive signal of such an alternating current that the voltage alternates in the shape of a sine function in accordance with the electrical angle (see FIG. 6) is applied to the B-phase field winding 33. As above, the A-phase and B-phase drive signals are out of phase with each other by 90 degrees. Consequently, alternate current (AC) magnetic fluxes are generated in the field windings 32, 33, to which such A-phase and B-phase drive signals are respectively applied. The AC magnetic fluxes pass between the yoke 31 and the magnetic poles of the magnet rotor Mr. Accordingly, the magnet rotor Mr rotates in accordance with voltage changes of the A-phase and B-phase drive signals, which are associated with the electrical angle.

As illustrated in FIG. 4, the reduction gear mechanism G includes gears 34, 35, 36, 37, which are spur gears. The output stage gear 34 is coupled to the pointer shaft 30b coaxially with the shaft 30b. The input stage gear 35 is fixed to the rotatable shaft 35a that is supported by the casing 30c, coaxially with the shaft 35a. The intermediate gears 36, 37 are supported by a rotatable shaft 36a, which is fixed to the casing 30c, coaxially with the shaft 36a, so that the gears 36, 37 are made integrally rotatable. The intermediate gear 36 is engaged with the output stage gear 34, whereas the intermediate gear 37 is engaged with the input stage gear 35.

Figure 6:
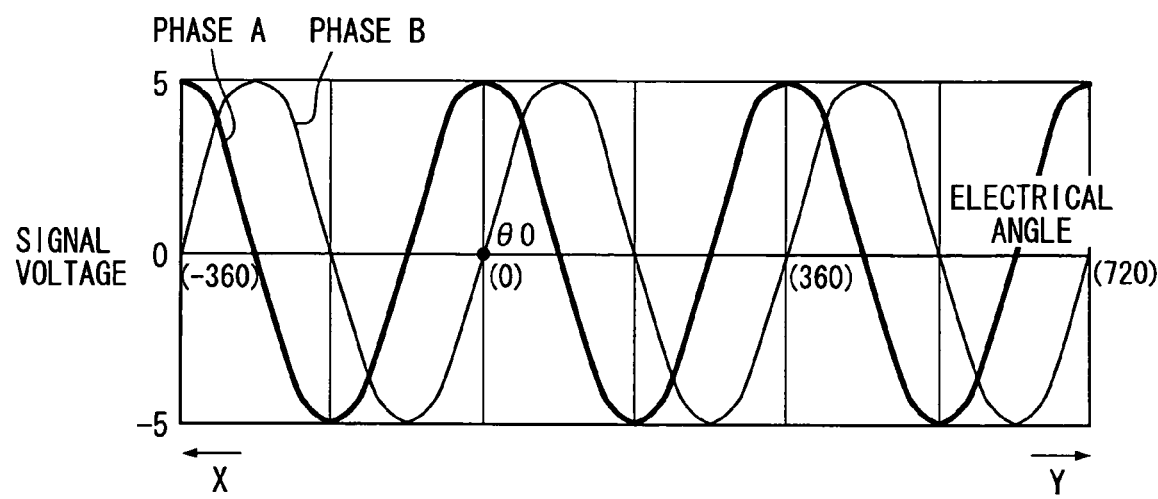
FIG. 6 is, a characteristic graph illustrating a drive signal of indicating instrument in accordance with the first embodiment.

Because of the above-described structure of the reduction gear mechanism G, the mechanism G reduces speed of rotation of the magnet rotor Mr of the step motor M so as to transmit the decelerated rotation to the pointer 20. Therefore, as the A-phase and B-phase drive signals change in accordance with the electrical angle, a rotational position of the magnet rotor Mr changes, so that a rotational position of the pointer 20 also changes. In addition, as illustrated in FIG. 6, in the present embodiment, a direction in which the electrical angle decreases corresponds to the zero-reset direction X of the pointer 20, and a direction in which the electrical angle increases corresponds to the speed increasing direction Y of the pointer 20.

Figure 7:
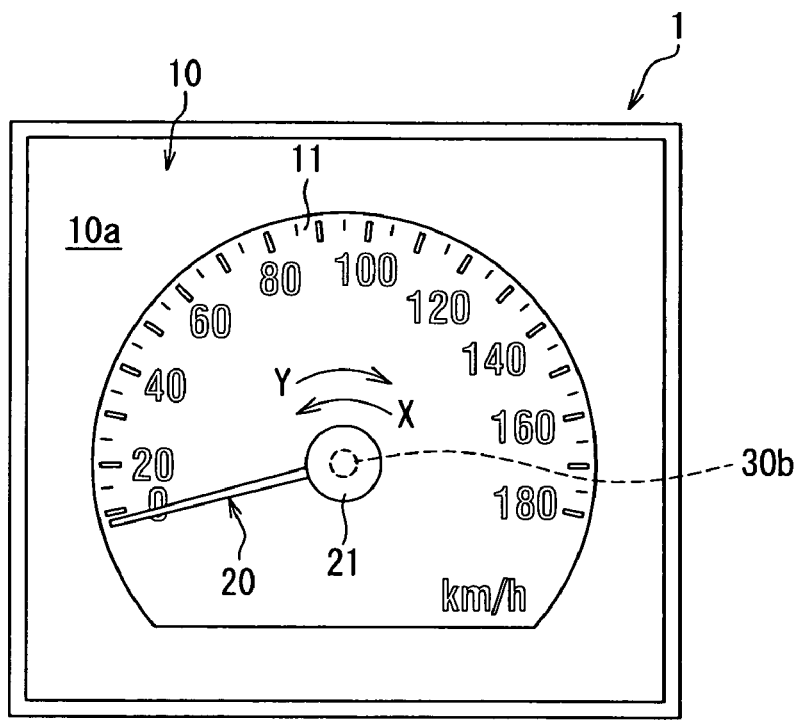
FIG. 7 is a front view illustrating an operating state of the indicating instrument that is different from that of FIG. 1, in accordance with the first embodiment.

As illustrated in FIG. 4, the stopper mechanism S includes a contact member 38 and a stopper member 39. The contact member 38 is formed in the shape of a thin strip of a plate that projects from the output stage gear 34, and rotatable integrally with the gear 34. The stopper member 39 is formed so as to have an L-shaped structure that projects from the casing 30c inward of the casing 30c. Along a rotating track of the contact member 38, a front end portion 39a of the stopper member 39 on its projection side is located further in a direction corresponding to the zero-reset direction X than the contact member 38. Thus, when the contact member 38 is engaged with the front end portion 39a of the stopper member 39 as a result of the rotation of the pointer 20 in the zero-reset direction X, the pointer 20 stops at a stopper position within a predetermined range from the zero position in the zero-reset direction X, as illustrated in FIG. 7. For this reason, in the step motor M of the present embodiment, the electrical angle that corresponds to the stopper position is set as a zero point θ0 (zero degree) illustrated in FIG. 6. In addition, the stopper position is set, at the time of production of the indicating instrument 1, for instance, within a range of 450 degrees in terms of the electrical angle of the step motor M from the zero position of the pointer 20 in the zero-reset direction X.

As above, in the present embodiment, the rotating inner device 30 including the step motor M and the reduction gear mechanism G, and the pointer 20 constitute a rotary drive system 70, which ranges from the step motor M to the pointer 20 via the reduction gear mechanism G.

As illustrated in FIG. 2, the control unit 50 is configured to mainly include a microcomputer, and mounted on the board 40. As illustrated in FIG. 3, the control unit 50 includes a memory 52. An execution program for performing various operations such as updating operation (described in greater detail hereinafter), normal operation and initialization operation, and the zero point θ0 (electrical angle) initialized by the initialization operation are stored beforehand in the memory 52. Also, the latest zero point θ0 updated by the updating operation is stored in the memory 52.

The control unit 50 is electrically connected to a door sensor 60 of the vehicle, an ignition switch IG, and a battery power source B. The control unit 50 is started by a direct electric supply from the battery power source B when opening of a door of the vehicle is detected by the door sensor 60. If the ignition switch IG is turned on before a set period (e.g., two minutes) elapses, the control unit 50 that has been started maintains an operating state by the electric supply from the battery power source B. After that, the operation of the control unit 50 is stopped as a result of turning off of the ignition switch IG. The control unit 50 that has been started stops its operation temporarily if the ignition switch IG is not turned on before the set period elapses. When the ignition switch IG is turned on after that, the control unit 50 is restarted. The control unit 50 stops its operation as a result of the turning off of the ignition switch IG. The restart of the control unit 50 is carried out in response to turning on of the ignition switch IG. Alternatively, the control unit 50 may be restarted in response to, for example, the opening of the door of the vehicle or depression of a brake pedal of the vehicle.

As illustrated in FIG. 3, the control unit 50 is electrically connected to the field windings 32, 33 of the step motor M. The control unit 50 performs the updating operation for updating the zero point θ0 stored in the memory 52 immediately after the control unit 50 has been started. In the updating operation of the present embodiment, processing for changing the electrical angle of the A-phase and B-phase drive signals applied to the field windings 32, 33, to the electrical angle whose phase is shifted from the initialized zero point θ0 retrieved from the memory 52, in the zero-reset direction X by 360 degrees, is repeated more than once as forcible synchronization loss processing. Additionally, in each forcible synchronization loss processing, the pointer 20 is rotated in the zero-reset direction X as long as the step motor M is not forced to lose synchronization.

If the step motor M does not lose synchronization (hereinafter referred to as pre-start synchronization loss) before the control unit 50 has been started, in accordance with the phase shifting of the electrical angle from the zero point θ0 by 180 degrees in the zero-reset direction X in each forcible synchronization loss processing, the step motor M is forced to lose synchronization, and the pointer 20 is swung further up in the speed increasing direction Y than the stopper position. After that, as a result of further phase shifting of the electrical angle in the zero-reset direction X, the pointer 20 returns to the stopper position in the zero-reset direction X, and the pointer 20 is stopped by the stopper mechanism S. Accordingly, at the end of the final forcible synchronization loss processing, the electrical angle corresponding to the stopper position of the pointer 20, i.e., the electrical angle whose phase is shifted from the initialized zero point θ0 in the zero-reset direction X by 360 degrees, is updated as the most recent zero point θ0 and stored in the memory 52.

If the pointer 20 is phase-shifted from the stopper position in the speed increasing direction Y by 180 degrees or more due to the pre-start synchronization loss, the step motor M is not forced to lose synchronization until the end of the forcible synchronization loss processing for the time when the pointer 20 reaches the stopper position. Then, in the forcible synchronization loss processing after the time when the pointer 20 reaches the stopper position, the step motor M is forced to lose synchronization similar to the above-described case in which the pre-start synchronization loss is not caused. Therefore, in this case as well, at the end of the final forcible synchronization loss processing, the electrical angle corresponding to the stopper position of the pointer 20 which is stopped by the stopper mechanism S, is updated at the most recent zero point θ0 and stored in the memory 52.

As illustrated in FIG. 3, the control unit 50 is electrically connected to a vehicle speed sensor 62. After the updating operation, the control unit 50 performs the normal operation for making the pointer 20 indicate a vehicle speed value detected by the vehicle speed sensor 62. In such normal operation, based on the zero point θ0 that is updated through the updating operation, the electrical angle of the A-phase and B-phase drive signals applied to the field windings 32, 33 are controlled to the electrical angle that corresponds to the detected vehicle speed value.

Figure 8:
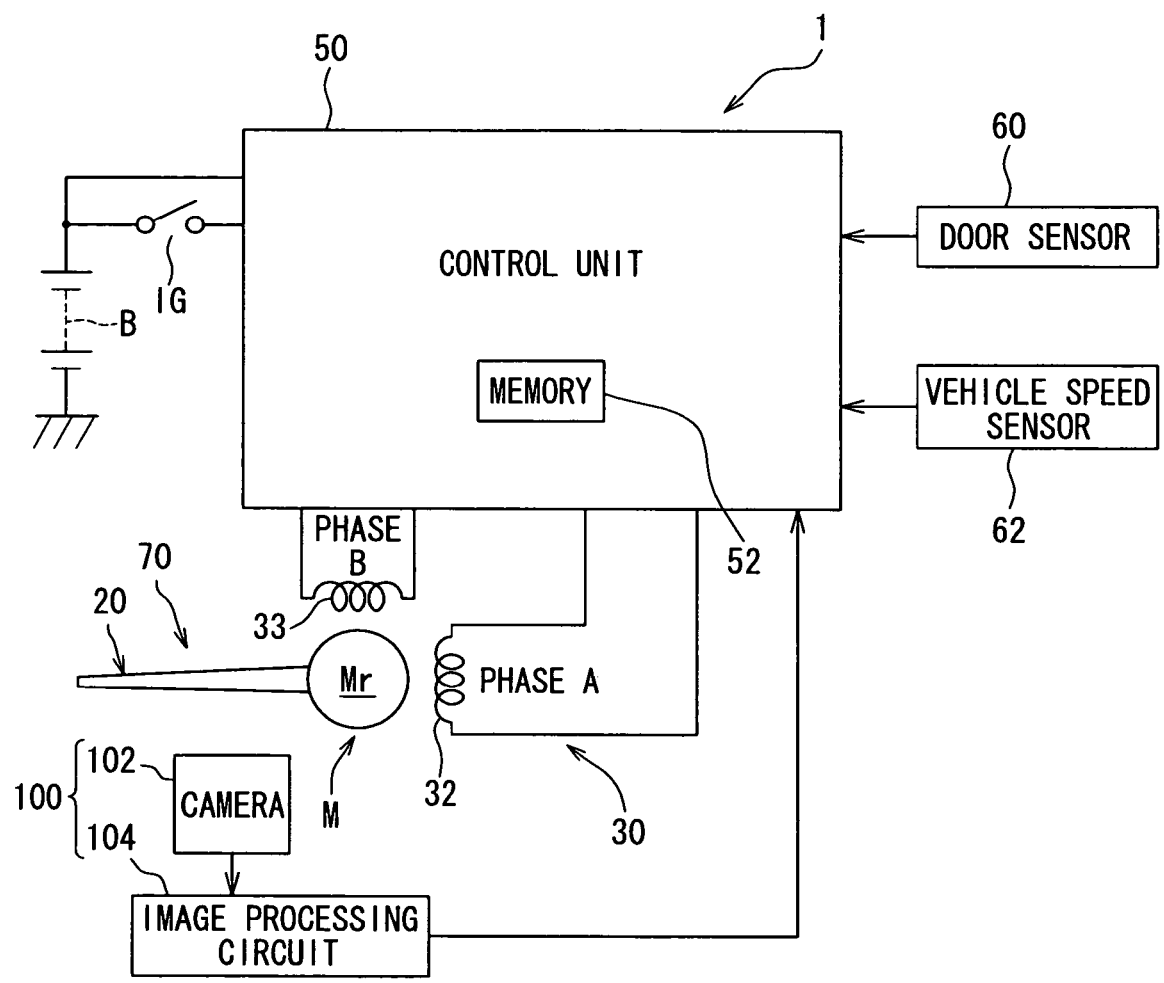
FIG. 8 is a block diagram illustrating an electric circuit configuration of an initialization device for making the indicating instrument perform initialization operation together with the electric circuit configuration of the indicating instrument in accordance with the first embodiment.

As illustrated in FIG. 8, the control unit 50 performs the initialization operation through the electrical connection of the control unit 50 with an initialization device 100 before factory shipments of the indicating instrument 1 as a product. The initialization device 100 includes a camera 102 that serves as an image taking means, and an image processing circuit 104 that serves as an image analyzing means. The camera 102 is constituted mainly of an image taking element such as a charge-coupled device (CCD), and disposed near the pointer 20 of the rotary drive system 70 to take an image of the pointer 20 during the initialization operation. The image processing-circuit 104 is constituted mainly of, for example, an integrated circuit (IC) chip for image processing, and electrically connected to the camera 102. The image processing circuit 104 generates image data of the pointer 20 taken by the camera 102 based on an image signal outputted from the camera 102. Furthermore, the image processing circuit 104, which is electrically connected to the control unit 50 during the initialization operation, detects a change of the rotational position of the pointer 20 through the image analysis of the generated image data of the pointer 20. The image processing circuit 104 outputs a detection signal that indicates the detected result to the control unit 50.

Figure 9:
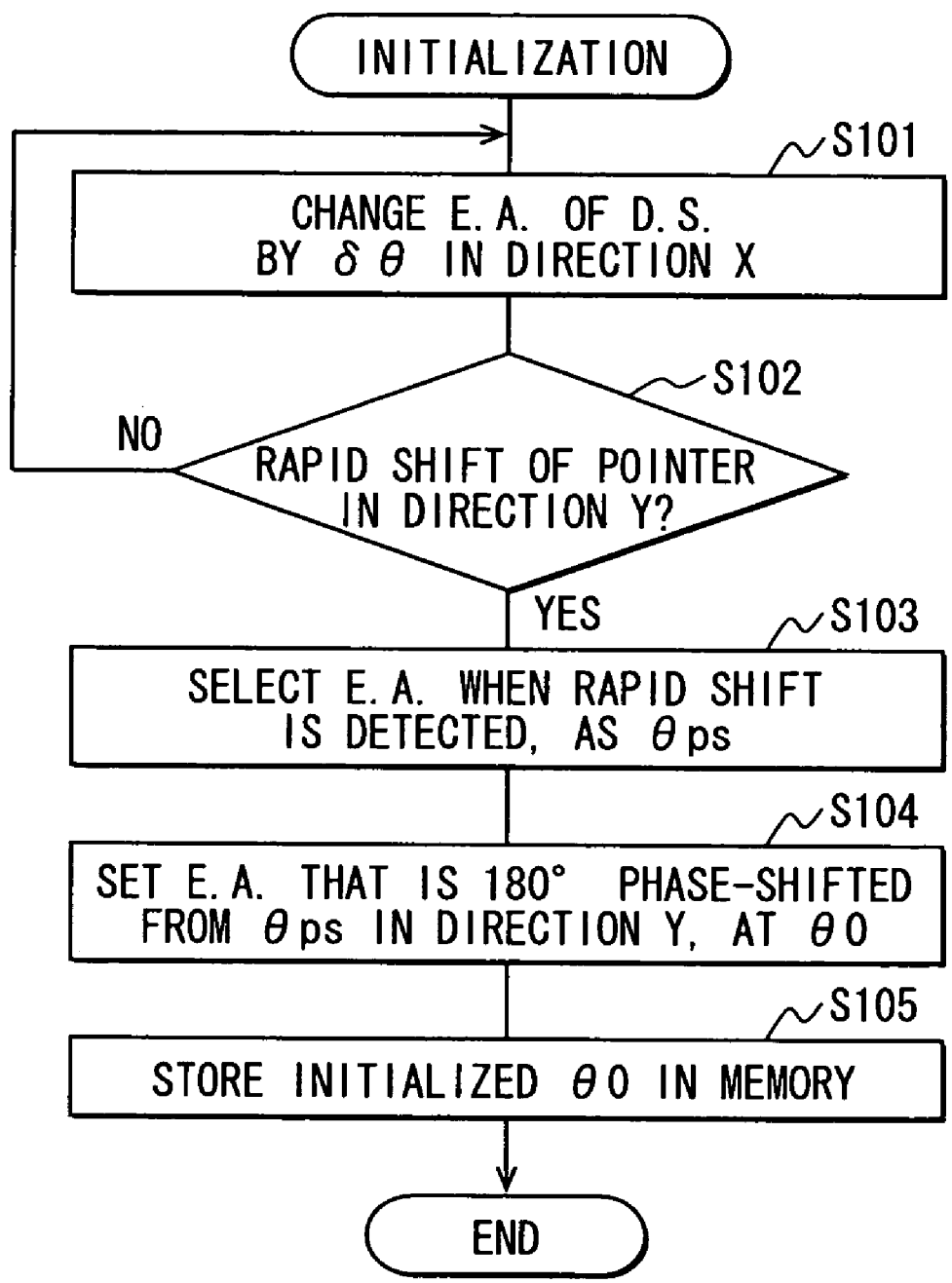
FIG. 9 is a flow chart illustrating the initialization operation of the indicating instrument in accordance with the first embodiment.

Such initialization operation of the control unit 50 using the initialization device 100 will be described below with reference to a flow chart in FIG. 9. This initialization operation is started when the control unit 50 is electrically connected to the image processing circuit 104 of the initialization device 100 so as to be started up.

At S101 in the initialization operation, by controlling the electrical angle of the A-phase and B-phase drive signals applied to the field windings 32, 33, the electrical angle at the execution start of S101 is changed by a minute angle δθ in the zero-reset direction X. The angle δθ is a control angle for realizing microstep drive that divides a step angle specific to the step motor M so as to smooth the change of the electrical angle. The angle δθ is set at about three degrees, for example. Thus, at S101, as long as the step motor M is not forced to lose synchronization, the pointer 20 is rotated in the zero-reset direction X to a position corresponding to this control angle δθ.

At S102, it is determined whether a rapid shift of the pointer 20 in the speed increasing direction Y due to the forcible synchronization loss of the step motor M by way of the rotational position change of the pointer 20 photographed by the camera 102 has been produced, based on the detection signal outputted from the image processing circuit 104. As a result of a phase shift of the electrical angle of the step motor M from the A-phase and B-phase drive signals in the speed increasing direction Y by 360 degrees due to the forcible synchronization loss of the step motor M during a period Tps1 to Tps2 in FIG. 10, the pointer 20 rotates to a position that corresponds to the above phase shift. This phenomenon of the rotation of the pointer 20 is referred to as the rapid shift of the pointer 20 in the speed increasing direction Y.

Figure 10:
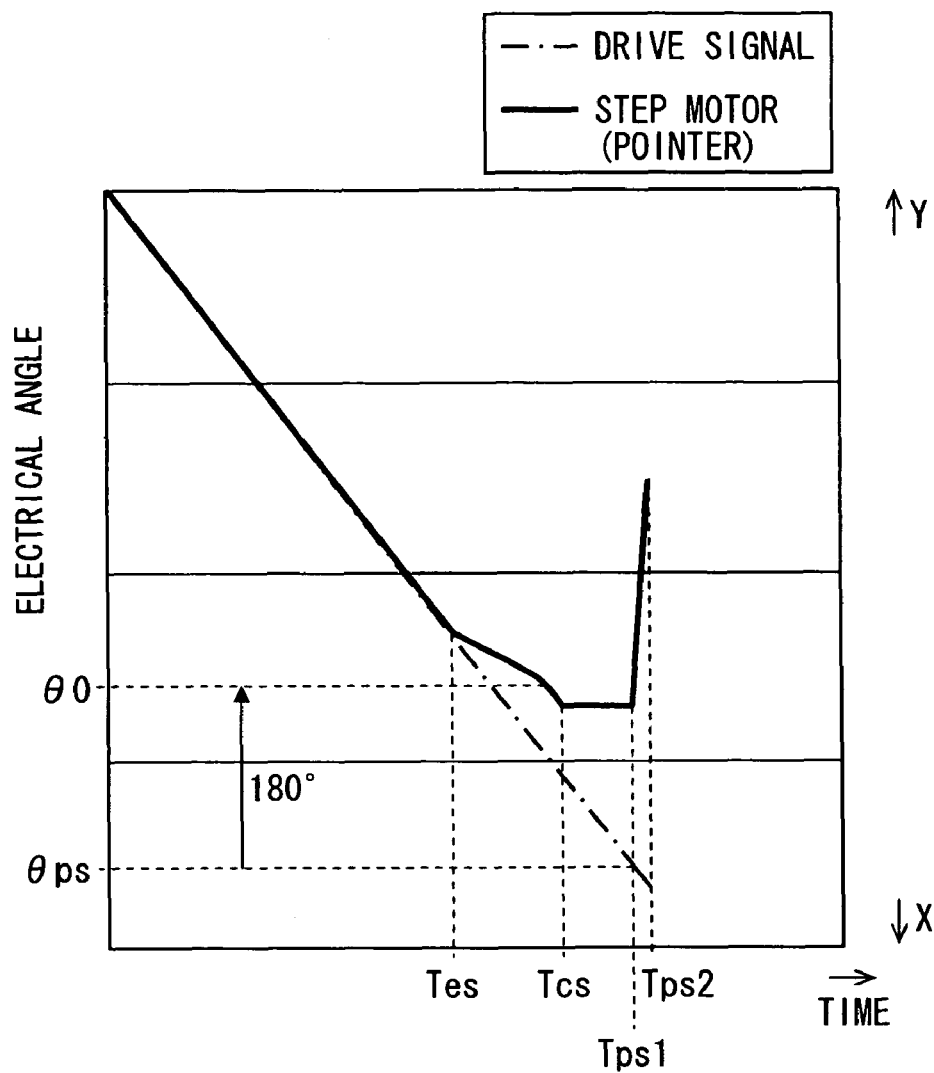
FIG. 10 is a characteristic graph illustrating the initialization operation of the indicating instrument in accordance with the first embodiment.

If negative determination is made at S102, control returns to S101. Accordingly, the procedure S101 is repeated as long as the rapid shift of the pointer 20 in the speed increasing direction Y is not detected by the image processing circuit 104. Therefore, as illustrated in FIG. 10, processing to gradually change the electrical angle of the A-phase and B-phase drive signals in the zero-reset direction X is continued. A cycle Pgr from execution start of the first procedure S101 back to the next procedure S101 through the negative determination at S102, is set at a very short period, which is as long as a rapid shift time (see the period Tps1 to Tps2 in FIG. 10) that it takes for the rotational position of the pointer 20 to phase-shift by 360 degrees due to the forcible synchronization loss of the step motor M, for example, 2 ms. For this reason, the gradual change of the electrical angle as a result of the repetition of the procedure S101 is made at a predetermined time rate δθ/Pgr of change, which is expressed by the cycle Pgr and the above-described control angle δθ.

On the other hand, if positive determination is made at S102, i.e., if the rapid shift of the pointer 20 in the speed increasing direction Y shown during the period Tps1 to Tps2 in FIG. 10 is detected by the image processing circuit 104, control proceeds to S103. At S103, the electrical angle controlled commonly to the A-phase and B-phase drive signals at a start time Tps1 of the rapid shift of the rotational position of the pointer 20, which is the time the rapid shift is detected, is selected as a synchronization loss electrical angle θps illustrated in FIG. 10.

At S104, which follows the procedure S103, the zero point θ0 is initialized based on the synchronization loss electrical angle θps selected at S103. Particularly, in the present embodiment illustrated in FIG. 10, it is estimated that stop operation of the pointer 20 by the stopper mechanism S has been started at the electrical angle that is phase-shifted from the synchronization loss electrical angle θps by 180 degrees in the speed increasing direction Y, and this 180-degree phase-shifted electrical angle is thereby set at the zero point θ0.

After this, at S105, which follows the procedure S104, the zero point θ0 that is initialized at S104 is stored in the memory 52, to end the present initialization operation.

In the above-described initialization operation of the first embodiment, by the gradual change of the electrical angle of the A-phase and B-phase drive signals applied to the field windings 32, 33 in the zero-reset direction X, the step motor M is forced to lose synchronization. The synchronization loss electrical angle θps at the synchronization loss detection time Tps1 is picked out. The electrical angle of the step motor M is phase-shifted from the drive signal by 360 degrees in the zero-reset direction X due to the forcible synchronization loss. Hence, the rapid shift of the pointer 20 in the speed increasing direction Y at the time of the forcible synchronization loss is a markedly great shift from immediately before its occurrence, and thus the rapid shift is easily detected. Moreover, this rapid shift becomes a physical phenomenon that is credibly detectable through the image analysis based on the image data of the pointer 20. For these reasons, the synchronization loss electrical angle θps is selected accurately.

Furthermore, by the initialization operation of the first embodiment, the zero point θ0 stored in the memory 52 corresponding to the stopper position of the pointer 20, is initialized at the electrical angle that is 180-degree phase-shifted from the synchronization loss electrical angle θps that is accurately picked out as above in the speed increasing direction Y. The forcible synchronization loss of the step motor M occurs theoretically at the synchronization loss electrical angle θps which is phase-shifted from the electrical angle when the stop operation of the pointer 20 by the stopper mechanism S is started (Tes in FIG. 10), in the zero-reset direction X by 180 degrees. In the indicating instrument of the above-described Patent No. JP3770095B2, a reduction gear mechanism that reduces speed of rotation of the step motor so as to transmit the decelerated rotation to the pointer is provided for a rotary drive system that ranges from the step motor to the pointer. In this structure, when the rotation of the pointer, which is brought to the stopper position in order to initialize the electrical angle corresponding to the stopper position, is reversed from the zero-reset direction to the indication value increasing direction, a discrepancy arises in correspondence between timing for separation of the pointer from the stopper position and the electrical angle of the drive signal because of the amount of backlashes that exist in the reduction gear mechanism. In this case, accuracy may be reduced in the initialization for relating the electrical angle at the time of the separation of the pointer from the stopper position or immediately therebefore, to the stopper position. When the pointer 20 is rotated in the zero-reset direction X via the reduction gear mechanism G by the gradual change of the electrical angle of the drive signals, a discrepancy does not easily arise in correspondence between the occurrence timing Tps1 of the forcible synchronization loss of the step motor M and the synchronization loss electrical angle θps of the drive signal because of backlashes between the gears 34, 36 and between the gears 35, 37. For these reasons, the zero point θ0 that is set at the electrical angle whose phase is shifted from the synchronization loss electrical angle θps in the speed increasing direction Y by 180 degrees, is a point that corresponds theoretically to the electrical angle of the start time Tes of the stop operation of the pointer 20 by the stopper mechanism S. In actuality, however, the pointer 20 rotates slightly in the zero-reset direction X (period Tes to Tcs in FIG. 10) from the start time Tes of the stop operation through the stopper mechanism S by the amount of elastic deformation of, for example, the mechanism S, and then the pointer 20 completely stops. Accordingly, the zero point θ0 is brought as close as possible to the electrical angle at the stop operation start time Tes among the electrical angles during the stop operation by the stopper mechanism S.

In the indicating instrument 1 of the first embodiment in which the zero point θ0 is set and stored in the memory 52 by such initialization operation, by controlling the electrical angle of the A-phase and B-phase drive signals to the zero point θ0 in the updating operation and the normal operation after factory shipments, the pointer 20 is appropriately stopped at the stopper position. As a result, control precision of the drive signal in the normal operation, and eventually, indication accuracy of the vehicle speed value by the pointer 20, are improved.

In addition, in the first embodiment described thus far, the procedures S101, S102 in the initialization operation may correspond to zero-reset processing, the procedures S102, S103 in the initialization operation may correspond to synchronization loss detection processing, and the procedures S104, S105 in the initialization operation may correspond to zero point setting processing.

Second Embodiment

Figure 11:
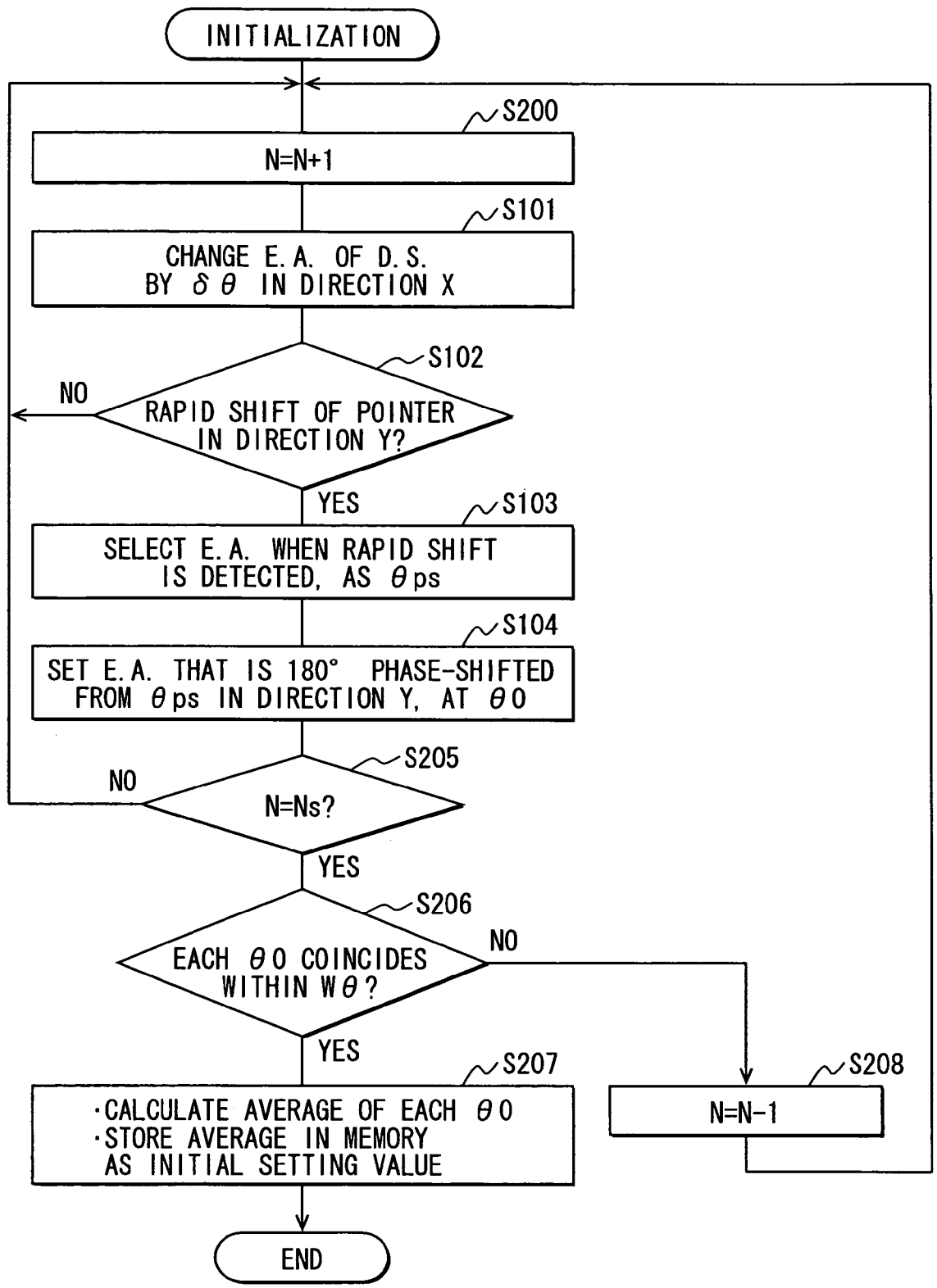
FIG. 11 is a flow chart illustrating initialization operation of an indicating instrument for a vehicle in accordance with a second embodiment of the invention.

A second embodiment of the invention is a modification of the first embodiment. In initialization operation of the second embodiment, as illustrated in FIG. 11, a procedure S200 is performed prior to execution of procedures S101 to S104. More specifically, at S200, a frequency counter N set in a memory 52 is incremented. The frequency counter N is set at a zero value (0 times) immediately after a start of the initialization operation.

After the execution of S104, in the initialization operation of the second embodiment, procedures S205 to S208 instead of S105 in the first embodiment are executed. More specifically, at S205, it is determined whether the frequency counter N of the memory 52 has reached a predetermined number Ns. Two times is used as the predetermined number Ns in the present embodiment. If negative determination is made as a result of such a procedure S205, control returns to S200 to perform the following procedures S101 to S104 again. On the other hand, if positive determination is made, control proceeds to S206.

At S206, whether the zero points θ0, which are set at the procedures S104 immediately before S206 and one cycle before S206, coincide within an allowable phase range we is determined. The allowable phase range we is set in an allowable range for a variation of the zero point θ0, for example, in a range of nine degrees. If positive determination is made as a result of such a procedure S206, control proceeds to S207, at which an average value of the zero points θ0 at the procedures S104 immediately before S207 and one cycle before S207 is calculated, and the calculated average value is stored in the memory 52 as an initial setting value of the zero point θ0.

On the other hand, if negative determination is made at S206, control proceeds to S208. The procedures S101 to S104, S205, and S206 are carried out again after the frequency counter N of the memory 52 is decremented at S208. Accordingly, the procedures S101 to S104, S205, and S206 are repeated until set values of the zero points θ0 at two consecutive procedures S104 coincide. The present initialization operation is ended with the execution of the procedure S207 as a result of this coincidence.

In the above-described initialization operation of the second embodiment, the initial setting value of the zero point θ0 stored in the memory 52 is a result of the coincidence of the set values obtained as a result of the repetition of a series of processings at S101 to S104, so that the initial setting value possesses higher reliability. Because of this, accuracy of the initialization for the zero point θ0 is improved. Additionally, in the second embodiment thus far described, the procedures S200, and S205 to S208 in the initialization operation may correspond to repetitive operation.

Third Embodiment

Figure 12:
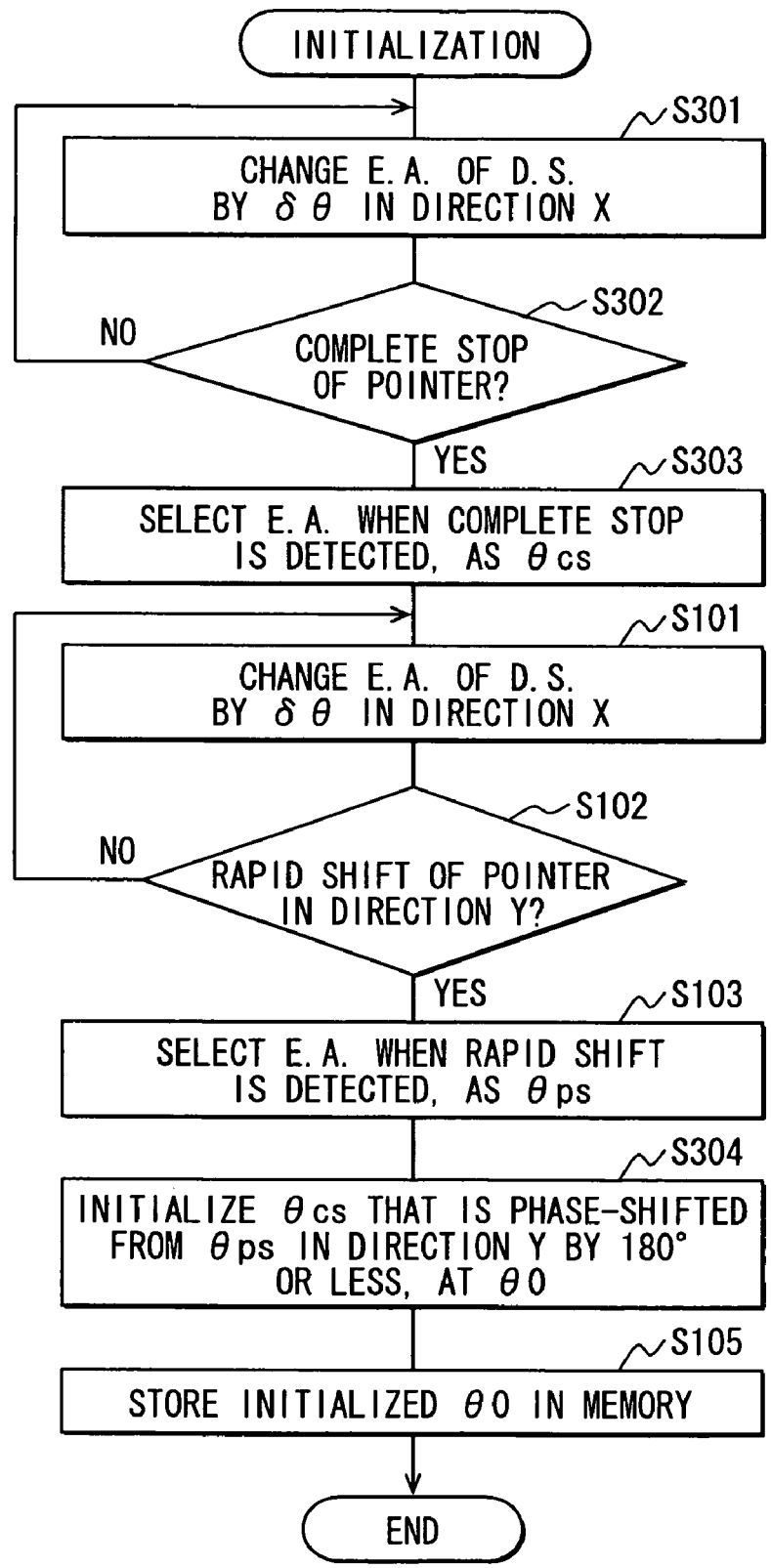
FIG. 12 is a flow chart illustrating initialization operation of an indicating instrument for a vehicle in accordance with a third embodiment of the invention.

A third embodiment of the invention is a modification of the first embodiment. In initialization operation of the third embodiment, as illustrated in FIG. 12, procedures S301 to S303 are performed prior to execution of a procedure S101. More specifically, at S301, by controlling the electrical angle of the A-phase and B-phase drive signals applied to the field windings 32, 33, the electrical angle at the execution start of this procedure S301 is changed by a minute angle δθ in the zero-reset direction X. By setting the angle δθ at the control angle δθ described in the first embodiment, the pointer 20 is rotated to a position corresponding to this angle δθ in the zero-reset direction X.

At S302, it is determined whether a complete stop of the pointer 20 by way of the rotational position change of the pointer 20 photographed by the camera 102 has been produced, based on the detection signal outputted from an image processing circuit 104. The complete stop is the following phenomenon, that is, the rotational position of the pointer 20, which has changed in the zero-reset direction X from the start time Tes of the stop operation through the stopper mechanism S by the amount of elastic deformation of, for example, the mechanism S, is stabilized substantially at the stopper position as illustrated in FIG. 13 during a period Tcs1 to Tcs2.

If negative determination is made at the above-described procedure S302, control returns to S301. Accordingly, the procedure S301 is repeated as long as the complete stop phenomenon of the pointer 20 is not detected by the image processing circuit 104. Therefore, as illustrated in FIG. 13, processing to gradually change the electrical angle of the A-phase and B-phase drive signals in the zero-reset direction X is continued. A cycle Pgr from an execution start of the first procedure S301 back to the next procedure S301 through the negative determination at S302 is set at the same as the cycle Pgr that is described in the first embodiment. As a consequence, the gradual change of the electrical angle as a result of the repetition of the procedure S301 is produced at a predetermined time rate δθ/Pgr of change.

Figure 13:
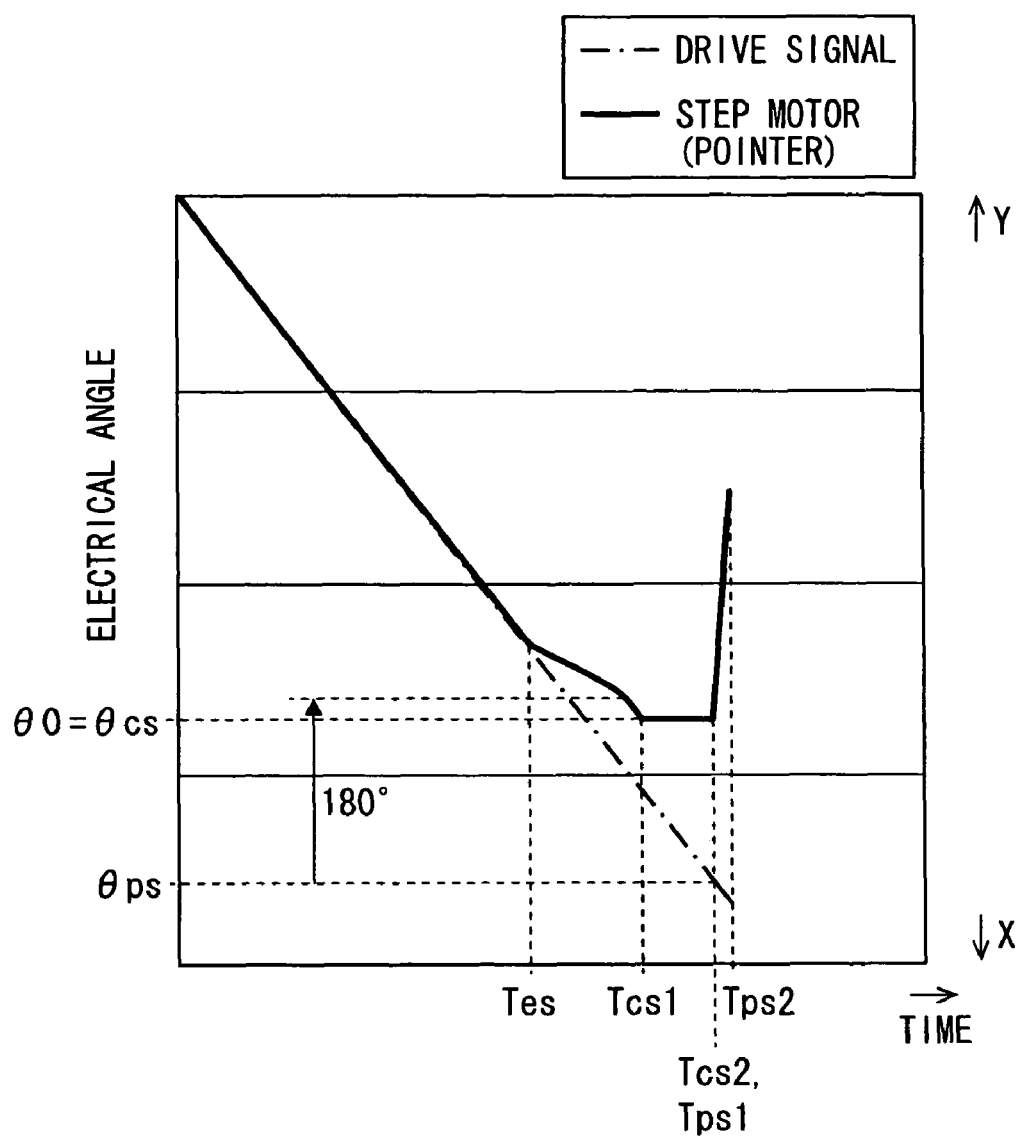
FIG. 13 is a characteristic graph illustrating the initialization operation of the indicating instrument in accordance with the third embodiment.

If positive determination is made at S302, i.e., if the complete stop of the pointer 20 as illustrated in FIG. 13 during a period Tcs1 to Tcs2 is detected by the image processing circuit 104, control proceeds to S303. At S303, at the start time Tcs1 of the stabilized position of the pointer 20 at the stopper position, which is the time the complete stop is detected, the electrical angle controlled commonly to the A-phase and B-phase drive signals is selected as a stop electrical angle θcs illustrated in FIG. 13.

After the execution of such a procedure S303, in the initialization operation of the third embodiment, a procedure S304 instead of the procedure S104 of the first embodiment is performed after the procedures S101 to S103. More specifically, at S304, as illustrated in FIG. 13, the stop electrical angle θcs, which is the electrical angle phase-shifted by 180 degrees or less in the speed increasing direction Y from the synchronization loss electrical angle θps that is selected by the procedure S103 immediately before S304, and which is picked out by the procedure S303 immediately before S304, is initialized at the zero point θ0. At S105, which follows such a procedure S304, the zero point θ0 that is initialized at S304 is stored in a memory 52 to end the present initialization operation.

In the above-described initialization operation of the third embodiment, the zero point θ0 initialized at the electrical angle that is phase-shifted from the synchronization loss electrical angle θps, at which the step motor M is forced to lose synchronization, in the speed increasing direction Y by 180 degrees or less, coincides with the electrical angle when the pointer 20 completely stops at the stopper position before this forcible synchronization loss. The complete stop of the pointer 20 is the physical phenomenon that is credibly detectable through the image analysis based on the image data of the pointer 20. Hence, the initialized zero point θ0 accords accurately with the electrical angle when the pointer 20 is stabilized securely at the stopper position through the stop operation by the stopper mechanism S. In addition, in the third embodiment thus far described, the procedures S301 to S303 in the initialization operation may correspond to stop detection processing, and the procedures S304, S105 in the initialization operation may correspond to the zero point setting processing.

Fourth Embodiment

Figure 14:
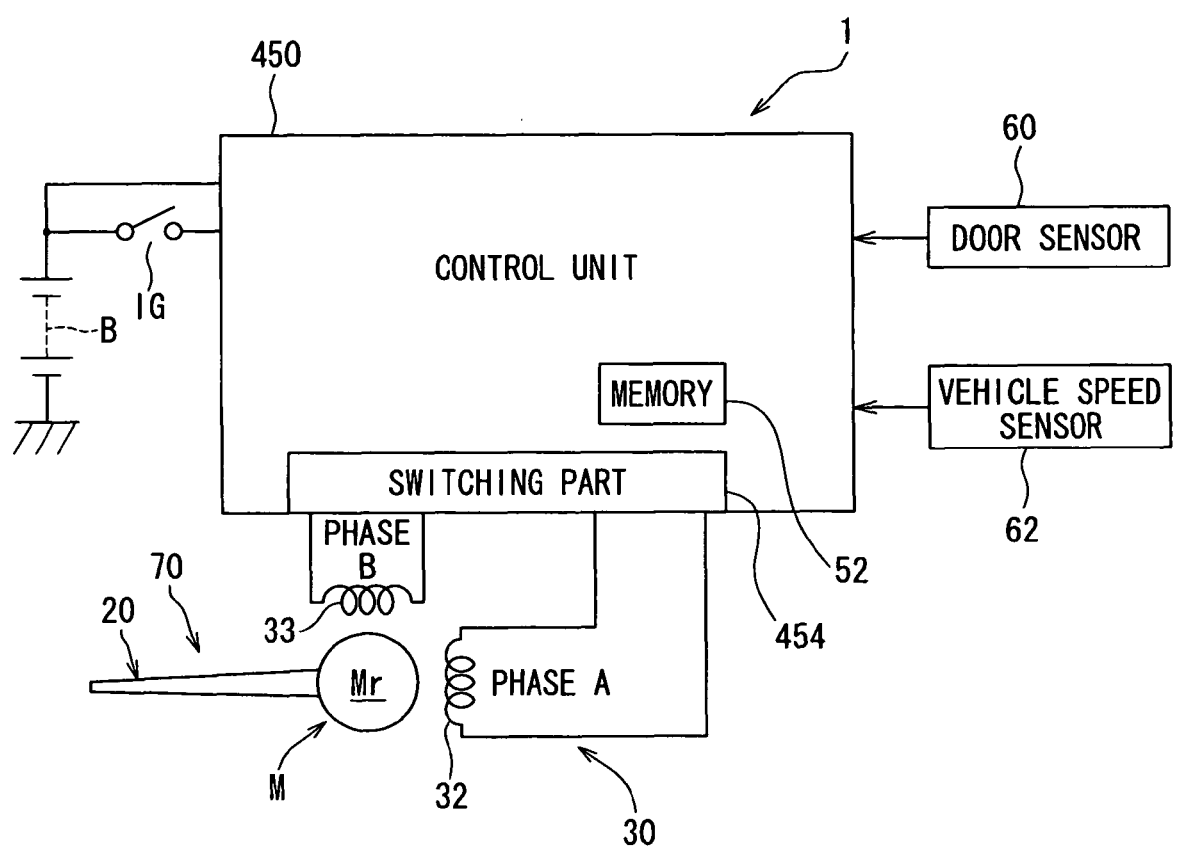
FIG. 14 is a block diagram illustrating an electric circuit configuration of an indicating instrument for a vehicle in accordance with a fourth embodiment of the invention.

A fourth embodiment of the invention is a modification of the first embodiment. In the fourth embodiment illustrated in FIG. 14, a control unit 450 that may serve as the control means includes a switching part 454 which is electrically connected to field windings 32, 33 of a step motor M.

Figure 15:
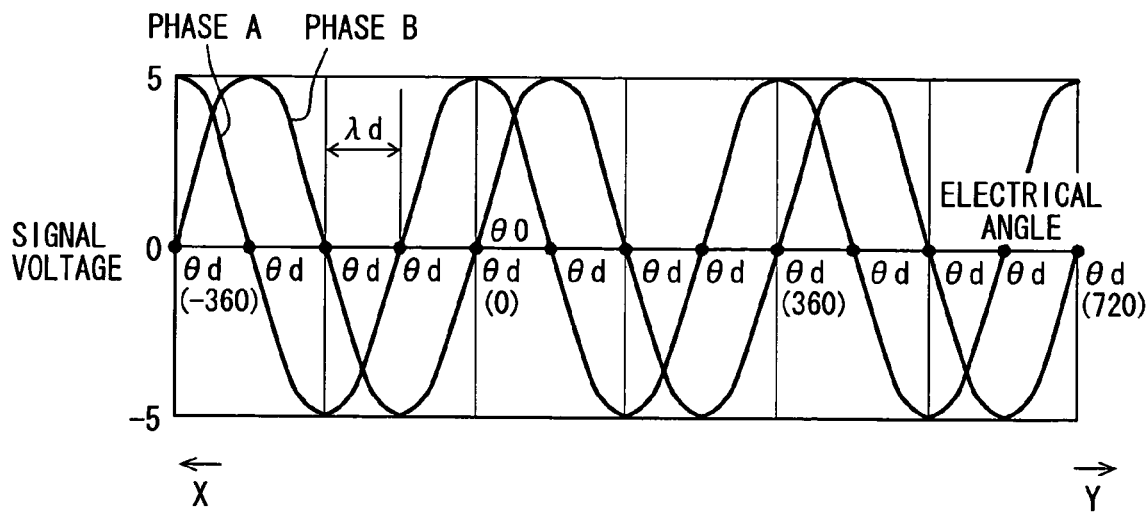
FIG. 15 is a characteristic graph illustrating operation of the indicating instrument in accordance with the fourth embodiment.

At the electrical angle where signal voltages (signal components) of the A-phase and B-phase drive signals are larger than a zero value (0V), the switching part 454 electrically connects paths for applying the signals to the corresponding field windings 32, 33 to the control unit 450, and closes paths for detecting induced voltage generated in the corresponding windings 32, 33. On the other hand, at the electrical angle where the signal voltages of the A-phase and B-phase drive signals take the zero value, the switching part 454 closes the paths for applying the signals to the corresponding field windings 32, 33, and electrically connects the paths for detecting the induced voltage generated in the corresponding windings 32, 33 to the control unit 450. Accordingly, in the present embodiment, in which the A-phase and B-phase drive signals alternate in the shape of the cosine function and in the shape of the sine function in accordance with the electrical angle, the electrical angle where the signal voltages take the zero value, i.e., the zero point θ0 and the electrical angles whose phases are shifted from the zero point θ0 at intervals of 90 degrees (indicated by black dots in FIG. 15), are set at detecting points θd of the induced voltage. For this reason, in the present embodiment, an interval λd of detection of the induced voltage is set at 90 degrees of the electrical angle.

A part for conducting the connection and shutoff of the paths by switching processing inside a microcomputer that constitutes the control unit 450 at every detecting point θd for the switching part 454 may be used. Or, a part for conducting the connection and shutoff of the paths at every detecting point θd by switching between input and output ports of the microcomputer, may be used for the switching part 454.

The control unit 450 of the fourth embodiment having the above-described switching part 454 performs the updating operation immediately after the control unit 450 has been started as follows. First, the electrical angle of the A-phase and B-phase drive signals applied to the field windings 32, 33 is changed to the electrical angle that is phase-shifted from the initialized zero point θ0 retrieved from a memory 52 in the speed increasing direction Y by a set angle (e.g., 270 degrees). Next, the electrical angle of the A-phase and B-phase drive signals is returned in the zero-reset direction X to the initialized zero point θ0 which is the detecting point θd. The induced voltage is detected in a winding of the field windings 32, 33 that corresponds to the drive signal whose signal voltage takes the zero value.

If the pre-start synchronization loss is not caused, the induced voltage to be detected is equal to or smaller than a set voltage. Accordingly, it is determined that a pointer 20 has stopped at the stopper position. Thus, the initialized zero point θ0, which is the detecting point θd for the induced voltage, is updated as the zero point θ0 stored in the memory 52 as it presently stands.

If the pointer 20 is phase-shifted from the stopper position in the speed increasing direction Y by 180 degrees or more due to the pre-start synchronization loss, the induced voltage to be detected is larger than the set voltage. As a result, it is determined that the pointer 20 is not stopped. Because of this, in such a case, the induced voltage of the winding of the field windings 32, 33 that corresponds to the drive signal whose signal voltage takes the zero value, is detected respectively at the detecting points θd, which are obtained as a result of the shift of the electrical angle of the A-phase and B-phase drive signals from the initialized zero point θ0 in the zero-reset direction X by every 90 degrees. As a result, if the induced voltage to be detected is equal to or smaller than the set voltage, the detecting point θd for this induced voltage is updated at the newest zero point θ0 and then stored in the memory 52.

Figure 16:
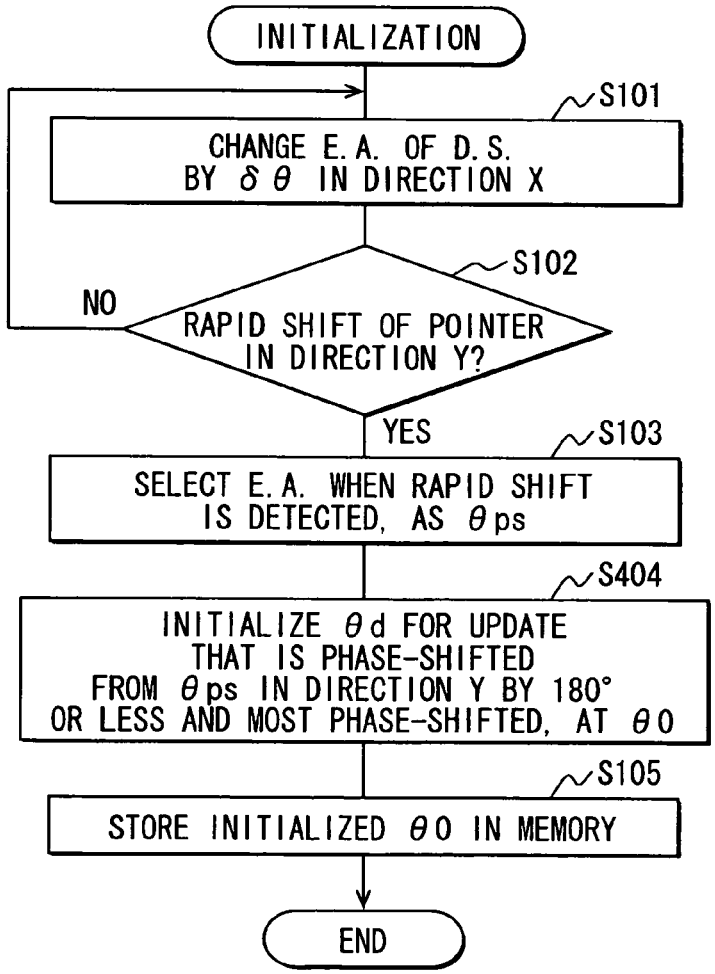
FIG. 16 is a flow chart illustrating initialization operation of the indicating instrument in accordance with the fourth embodiment.
Figure 17:
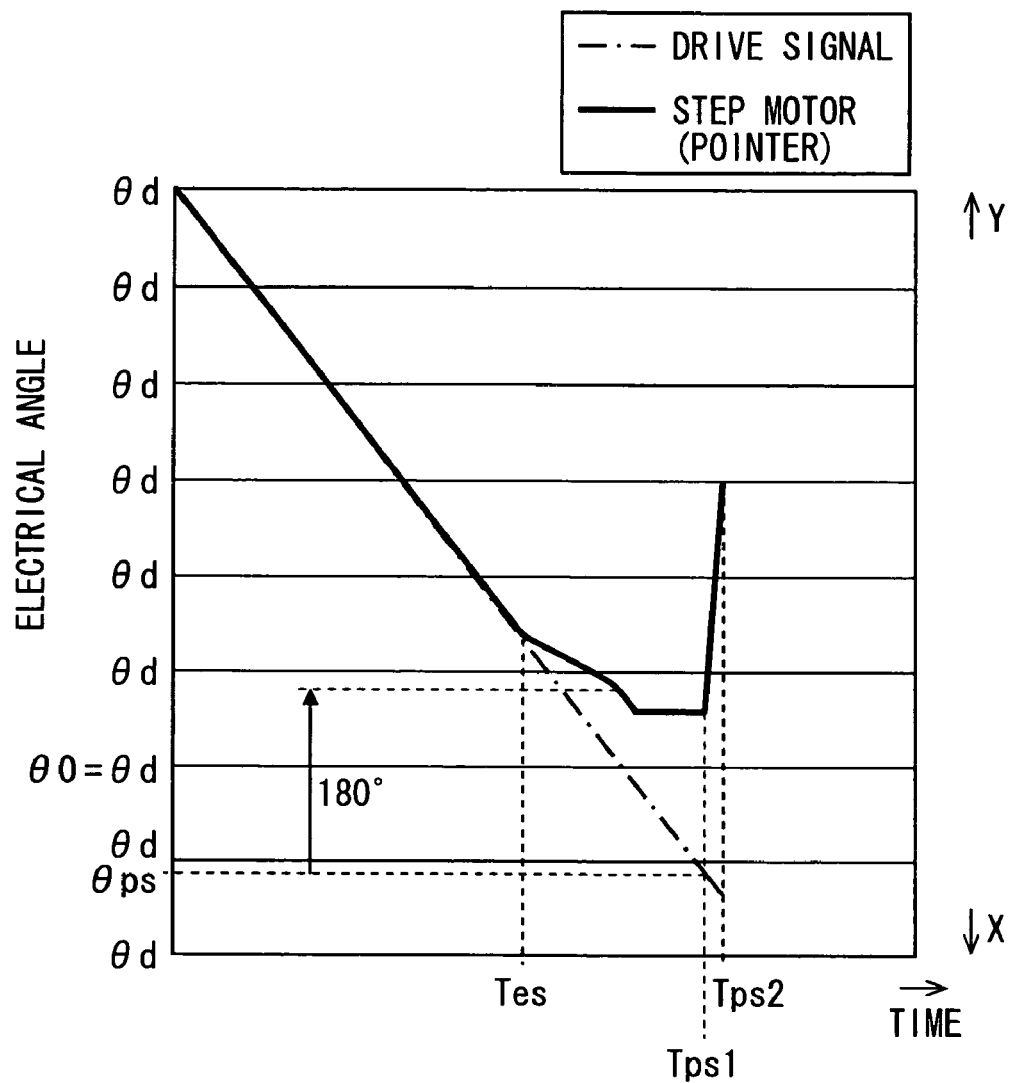
FIG. 17 is a characteristic graph illustrating the initialization operation of the indicating instrument in accordance with the fourth embodiment.

In the initialization operation of the fourth embodiment carried out by the control unit 450 which is configured in the above-described manner, as illustrated in FIG. 16, a procedure S404 instead of the procedure S104 of the first embodiment is performed through the procedures S101 to S103. More specifically, at S404, as illustrated in FIG. 17, the electrical angle among the detecting points θd of the updating operation, which is phase-shifted in the speed increasing direction Y by 180 degrees or less from the synchronization loss electrical angle θps selected at S103 immediately before S404 and which is also the most phase-shifted, is initialized at the zero point θ0. At S105, which follows such a procedure S404, the zero point θ0 that is initialized at S404 is stored in the memory 52 to end the present initialization operation.

In the above-described initialization operation of the fourth embodiment, the zero point θ0 initialized at the electrical angle that is phase-shifted from the synchronization loss electrical angle θps, at which the step motor M is forced to lose synchronization, in the speed increasing direction Y by 180 degrees or less, coincides with the electrical angle among the detecting points θd of the updating operation which is the most phase-shifted. Accordingly, the initialized zero point θ0 is a particularly accurate electrical angle that is brought as close as possible to the electrical angle at the start time Tes of the stop operation, among the electrical angles during the stop operation of the pointer 20 by a stopper mechanism S. Moreover, the detecting point θd is the electrical angle that makes possible the determination of the stop of the pointer 20 based on the detection of induced voltage as a result of the signal voltage of one of the A-phase and B-phase drive signals being the zero value in the updating operation. For these reasons, the initialized zero point θ0 is particularly advantageous in accurately achieving the update on the zero point θ0 corresponding to the stopper position after factory shipments, focusing on the induced voltage generated in the field windings 32, 33. In addition, in the fourth embodiment thus far described, the procedures S404, S105 in the initialization operation may correspond to the zero point setting processing.

Fifth Embodiment

Figure 18:
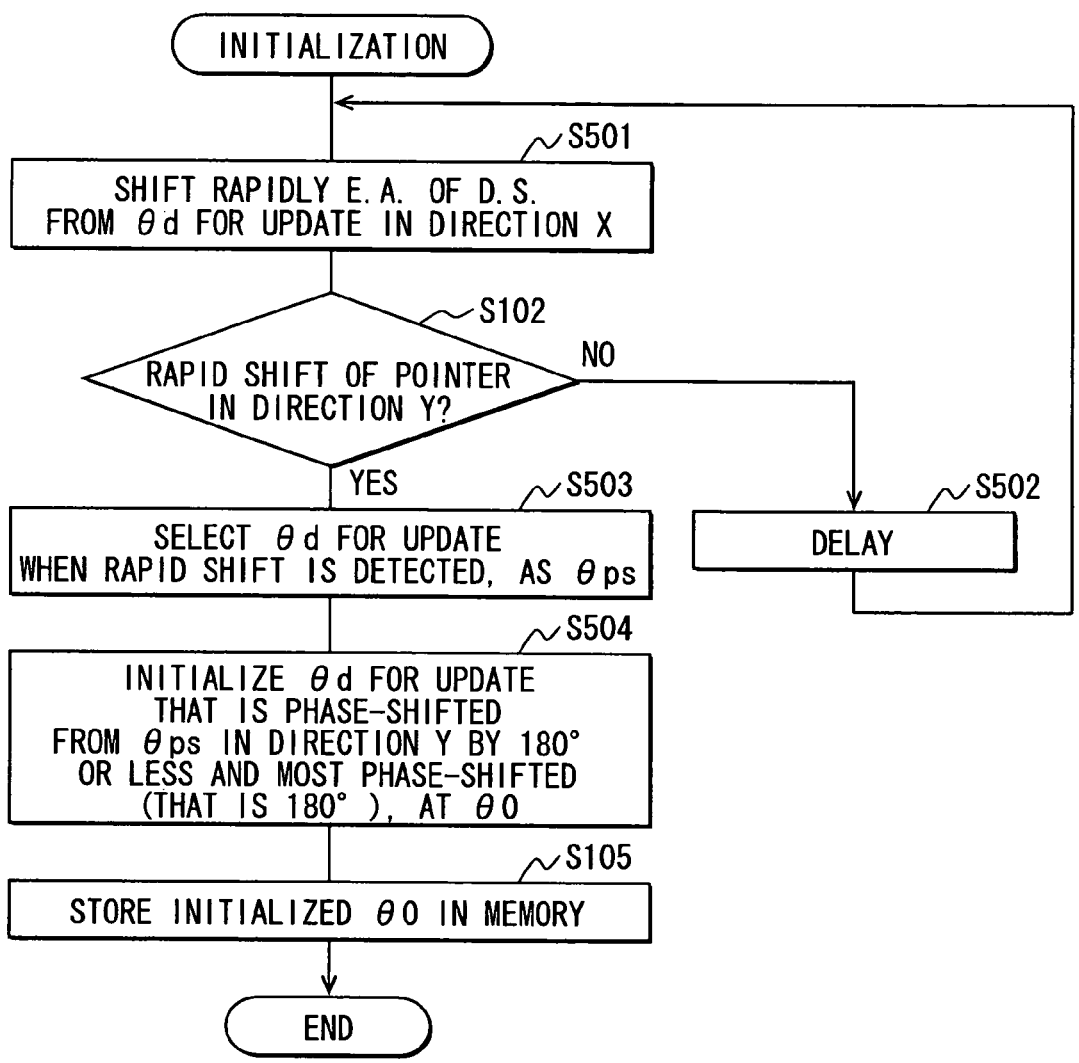
FIG. 18 is a flow chart illustrating initialization operation of an indicating instrument for a vehicle in accordance with a fifth embodiment of the invention.

A fifth embodiment of the invention is a modification of the fourth embodiment. As illustrated in FIG. 18, in the initialization operation of the fifth embodiment, a procedure S501 instead of the procedure S101 of the fourth embodiment is performed prior to execution of the procedures S102, S503. More specifically, at S501, by controlling the electrical angle of the A-phase and B-phase drive signals applied to the field windings 32, 33, the electrical angle at the execution start of the procedure S501 is rapidly shifted from the present electrical angle, which is the detecting point θd of the updating operation, in the zero-reset direction X. Meanwhile, the amount of change of the electrical angle is set to be much larger than the step angle specific to a step motor M. In the present embodiment, in particular, the change amount is set at 90 degrees, which is equal to the detection interval λd (see FIG. 15) for induced voltage in the updating operation explained in the fourth embodiment.

Figure 19:
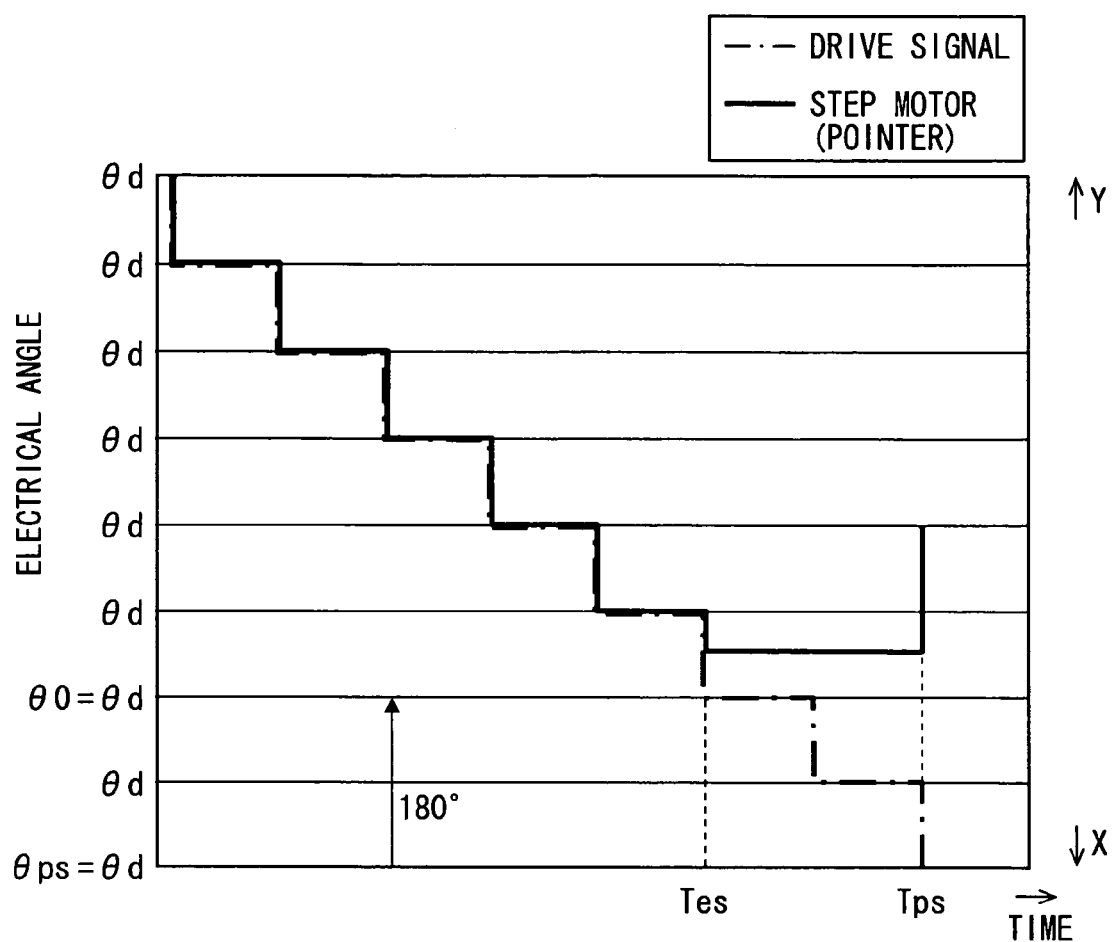
FIG. 19 is a characteristic graph illustrating the initialization operation of the indicating instrument in accordance with the fifth embodiment.

At S102, which follows such a procedure S501, it is determined whether the rapid shift of a pointer 20 in the speed increasing direction Y has occurred instantaneously at Tps as illustrated in FIG. 19 due to the forcible synchronization loss of the step motor M, based on the detection signal outputted from an image processing circuit 104. As a result, if negative determination is made at S102, in the initialization operation of the fifth embodiment, the return of control back to the procedure S501 is delayed through execution of a procedure S502. A cycle Pst from an execution start of the procedure S501 back to the following procedure S501 after the negative determination at S102 and the delay procedure S502, is set at a period that is much longer than the cycle Pgr described in the first embodiment, for example, at 100 ms. As a consequence, as long as the rapid shift of the pointer 20 is not detected, the electrical angle of the A-phase and B-phase drive signals changes in a stepwise fashion in the zero-reset direction X every time the procedure S501 is repeated in the cycle Pst.

If positive determination is made at S102, control proceeds to S503 instead of the procedure S103 in the fourth embodiment. At this procedure S503, the electrical angle among the detecting points θd of the updating operation, which is controlled commonly to the A-phase and B-phase drive signals at the rapid shift time Tps of the rotational position of the pointer 20 that is the time of detection of the rapid shift, so as to reach the detecting point θd at S501 immediately before the procedure S503, is picked out as the synchronization loss electrical angle θps as illustrated in FIG. 19. After the execution of such a procedure S503, in the initialization operation of the fifth embodiment, a procedure S504 instead of S404 in the fourth embodiment is executed.

More specifically, at S504, the electrical angle among the detecting points θd of the updating operation, which is phase-shifted in the speed increasing direction Y by 180 degrees or less from the synchronization loss electrical angle θps selected at S503 immediately before S504, and which is also the most phase-shifted, is initialized at the zero point θ0. Particularly, in the present embodiment that performs the determination of occurrence of the rapid shift every time the detecting point θd of the updating operation is changed in a stepwise manner by the amount of change of 90 degrees, the electrical angle that is phase-shifted from the synchronization loss electrical angle θps by 180 degrees or less and is also the most phase-shifted coincides with the electrical angle whose phase shift is 180 degrees, as illustrated in FIG. 19. At S105, which follows such a procedure S504, the zero point θ0 that is initialized at S504 is stored in a memory 52 to end the present initialization operation.

In the above-described initialization operation of the fifth embodiment, by repeatedly changing the electrical angle of the A-phase and B-phase drive signals in a stepwise manner in the zero-reset direction X in the predetermined cycle Pst, the step motor M is forced to lose synchronization. The synchronization loss electrical angle θps at the synchronization loss detection time Tps is selected. The rapid shift of the pointer 20 in the speed increasing direction Y at the time of the forcible synchronization loss of the step motor M is unfailingly detectable based on the image data of the pointer 20, and moreover, because the rapid shift occurs only at the time of the stepwise change of the electrical angle, detectability of the rapid shift is high. In consequence, based on the accurately-selected synchronization loss electrical angle θps, the zero point θ0 which is accurate and which is advantageous in updating during the updating operation is initialized, according to the principle similar to the fourth embodiment.

In the fifth embodiment thus far described, the procedures S501, S102, S502 in the initialization operation may correspond to the zero-reset processing, the procedures S102, S503 in the initialization operation may correspond to the synchronization loss detection processing, and the procedures S504, S105 in the initialization operation may correspond to the zero point setting processing.

Modifications of the above embodiments will be described below. The embodiments of the invention are described above. Nevertheless, the invention is not interpreted by limiting itself to these embodiments, and may be applied to various embodiments without departing from the scope of the invention.

More specifically, in the first to fifth embodiments, the A-phase and B-phase drive signals may also be signals other than those which change in the shape of a cosine function or sine function, e.g., signals that change in the shape of a trapezoidal wave or triangular wave, as long as they are signals that alternate with a phase difference of 90 degrees between each other. Furthermore, in the first to fifth embodiments, the vehicle state value indicated by the pointer 20 may also be a fuel remaining amount, coolant temperature, or an engine rotation speed, for example, as long as it is a value related to various states of the vehicle.

In the first to fifth embodiments, a device for engaging directly with the pointer 20 to stop the pointer 20 may be used as the stopper mechanism S. Moreover, in the first to fifth embodiments, without providing the reduction gear mechanism G for the main body 30a of the rotating inner device 30, the rotary drive system 70 that transmits the rotation of the step motor M in the main body 30a directly to the pointer 20 may be adopted. Furthermore, without providing the switching part 454 in the control unit 450 in the fourth and fifth embodiments, the updating operation by the repetition of the forcible synchronization loss processing similar to the first embodiment, may be carried out. In addition, in the updating operation in this case, the detecting point θd is no longer required. Accordingly, in the initialization operation, the electrical angle where the signal voltage of one of the A-phase and B-phase drive signals, which is the signal component, is the zero value, is considered as the electrical angle that is virtually identical with the detecting point θd.

With regard to the initialization operation, at S102, S103 in the first to fifth embodiments, as long as it is the physical phenomenon that is generated due to the forcible synchronization loss of the step motor M, for example, vibration or a noise produced in components of the rotary drive system 70, may be detected, and the electrical angle at this detection time may be picked out as the synchronization loss electrical angle θps. Moreover, regarding the initialization operation, at S104 in the first and second embodiments, the electrical angle, which takes a predetermined value that is phase-shifted from the synchronization loss electrical angle θps in the speed increasing direction Y by less than 180 degrees, may be set at the zero point θ0. Additionally, in respect of the initialization operation, at S205 in the second embodiment, the repeat count Ns at S101 to S104 may be set at three or more. In this case, the set value at S104 as of the most recent number Ns may be used as the zero point θ0 on which the determination of coincidence and the calculation of the average value are performed at S206, S207 in the initialization operation. Also, in this case, by a majority method for the set value at S104 as of the most recent number Ns, the zero point θ0 may be initialized.

In the initialization operation, in the third to fifth embodiments, a series of processings from S301, S101, S501 to S304, S404, S504 respectively, may be repeated in accordance with the second embodiment. In addition, as for the initialization operation, at S404, S504 in the fourth and fifth embodiments, provided that it is the electrical angle that is phase-shifted from the synchronization loss electrical angle θps in the speed increasing direction Y by 180 degrees or less, among the electrical angles which are the detecting points θd of the updating operation, the zero point θ0 may also be those other than the most phase-shifted electrical angle (e.g., in the fifth embodiment, this phase shift is 0 degree or 90 degrees). Lastly, relating to the initialization operation, at S501 in the fifth embodiment, the amount of change by which the electrical angle is changed in a stepwise manner may be set at the amount that is different from 90 degrees, which is equal to the detection interval λd.

Additional advantages and modifications will readily occur to those skilled in the art. The invention in its broader terms is therefore not limited to the specific details, representative apparatus, and illustrative examples shown and described.

What is claimed is:

1. A method for initializing an indicating instrument for a vehicle, wherein the instrument includes:
    a pointer that is rotatable in a zero-reset direction to return to a zero position, which indicates a zero value of a vehicle state value of the vehicle;
    a step motor that includes a field winding and is configured to rotate the pointer upon application of a drive signal, which alternates in accordance with an electrical angle, to the field winding;
    a rotary drive system that ranges from the step motor to the pointer;
    a stopper mechanism that is configured to stop the pointer, which rotates in the zero-reset direction, at a stopper position located within a predetermined range from the zero position in the zero-reset direction; and
    a control means for controlling the drive signal based on a zero point, which is the electrical angle that corresponds to the stopper position, the method comprising:
    performing zero-reset processing that includes making the control means control the drive signal to rotate the pointer in the zero-reset direction in order to force the step motor to lose synchronization;
    performing synchronization loss detection processing that includes:
        detecting a first physical phenomenon, which is generated in the rotary drive system due to forcible synchronization loss of the step motor during the zero-reset processing; and
        selecting the electrical angle of the drive signal at a time of detection of the first physical phenomenon as a synchronization loss electrical angle; and
    performing zero point setting processing that includes setting the electrical angle, which is phase-shifted from the synchronization loss electrical angle in an indication value increasing direction by 180 degrees or less, as the zero point which is stored in the control means, the indication value increasing direction being opposite from the zero-reset direction.

2. The method according to claim 1, wherein the synchronization loss detection processing includes:
    obtaining image data of the rotary drive system during the zero-reset processing; and
    detecting the first physical phenomenon based on the image data of the rotary drive system.

3. The method according to claim 1, wherein:
    the rotary drive system includes a reduction gear mechanism that is configured to reduce speed of rotation of the step motor and to transmit the rotation of the step motor to the pointer so that the pointer is rotated; and
    the zero-reset processing includes making the control means control the drive signal to rotate the pointer in the zero-reset direction through the reduction gear mechanism.

4. The method according to claim 1, further comprising performing repetitive operation that includes:
- repeating a combination of the zero-reset processing, the synchronization loss detection processing, and the zero point setting processing; and
- storing a coincidental zero point in the control means as an initial setting value, wherein:
  - the zero point is one of a plurality of zero points set by the zero point setting processing in each of the repeated combination; and
  - when the plurality of zero points coincides with each other, an identical value of the plurality of zero points is the coincidental zero point.

5. The method according to claim 1, wherein the zero-reset processing includes making the control means continue to gradually change the electrical angle of the drive signal at a predetermined time rate so as to rotate the pointer in the zero-reset direction.

6. The method according to claim 5, wherein the zero point setting processing includes setting the electrical angle, which is phase-shifted from the synchronization loss electrical angle in the indication value increasing direction by 180 degrees, as the zero point.

7. The method according to claim 5, further comprising performing stop detection processing that includes:
- detecting a second physical phenomenon, which is generated in the rotary drive system in accordance with a complete stop of the pointer at the stopper position before the forcible synchronization loss of the step motor during the zero-reset processing; and
- selecting the electrical angle of the drive signal at a time of detection of the second physical phenomenon as a stop electrical angle, wherein:
  - the stop electrical angle is phase-shifted from the synchronization loss electrical angle in the indication value increasing direction by 180 degrees or less; and
  - the zero point setting processing includes setting the stop electrical angle as the zero point.

8. The method according to claim 7, wherein:
the stop detection processing includes:
- obtaining image data of the rotary drive system during the zero-reset processing; and
- detecting the second physical phenomenon based on the image data of the rotary drive system; and
the synchronization loss detection processing includes detecting the first physical phenomenon based on the image data of the rotary drive system.

9. The method according to claim 5, wherein a signal component of the drive signal takes a zero value at the electrical angle that is set as the zero point by the zero point setting processing.

10. The method according to claim 9, wherein the electrical angle, which is set as the zero point by the zero point setting processing and at which the signal component of the drive signal takes the zero value, is the most phase-shifted from the synchronization loss electrical angle.

11. The method according to claim 1, wherein the zero-reset processing includes making the control means repeatedly change the electrical angle of the drive signal in a step-wise manner with a predetermined timing so as to rotate the pointer in the zero-reset direction.

12. The method according to claim 11, wherein a signal component of the drive signal takes a zero value at the electrical angle that is set as the zero point by the zero point setting processing.

13. The method according to claim 12, wherein the electrical angle, which is set as the zero point by the zero point setting processing and at which the signal component of the drive signal takes the zero value, is the most phase-shifted from the synchronization loss electrical angle.

* * * * *